(12) United States Patent
Wang et al.

(10) Patent No.: US 11,804,184 B2
(45) Date of Patent: Oct. 31, 2023

(54) SOURCE DRIVER, DISPLAY PANEL AND CONTROL METHOD THEREFOR, AND DISPLAY APPARATUS WITH ADJUSTABLE NUMBER OF DATA OUTPUT CHANNELS

(71) Applicant: BOE TECHNOLOGY GROUP CO., LTD., Beijing (CN)

(72) Inventors: Tangxiang Wang, Beijing (CN); Fei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 17/607,831

(22) PCT Filed: Nov. 30, 2020

(86) PCT No.: PCT/CN2020/132761
§ 371 (c)(1),
(2) Date: Oct. 29, 2021

(87) PCT Pub. No.: WO2021/109969
PCT Pub. Date: Jun. 10, 2021

(65) Prior Publication Data
US 2022/0223111 A1    Jul. 14, 2022

(30) Foreign Application Priority Data
Dec. 5, 2019 (CN) .......................... 201911236632.7

(51) Int. Cl.
*G11C 19/28* (2006.01)
*G09G 3/3266* (2016.01)
*G09G 3/3275* (2016.01)

(52) U.S. Cl.
CPC ........... *G09G 3/3266* (2013.01); *G11C 19/28* (2013.01); *G09G 3/3275* (2013.01);
(Continued)

(58) Field of Classification Search
CPC .... G11C 19/28; G09G 3/3266; G09G 3/3275; G09G 2300/0426; G09G 2310/027;
(Continued)

(56) References Cited

U.S. PATENT DOCUMENTS

2003/0043132 A1    3/2003 Nakamura
2003/0112230 A1    6/2003 Maeda et al.
(Continued)

FOREIGN PATENT DOCUMENTS

CN    1348167 A    5/2002
CN    1424821 A    6/2003
(Continued)

OTHER PUBLICATIONS

The First Office Action of Priority Application No. CN 201911236632.7 issued by the Chinese Patent Office dated Sep. 3, 2020.

*Primary Examiner* — Adam J Snyder
(74) *Attorney, Agent, or Firm* — IP & T GROUP LLP

(57) ABSTRACT

A source driver includes a plurality of shift register groups cascaded in sequence, an enable control circuit and at least one switching circuit electrically connected to the enable control circuit. Each shift register group includes a plurality of stages of shift registers, and is configured to sample digitized image data; a first start signal of an n-th shift register group is output by an (n−1)-th shift register group, n is a positive integer greater than 2. The enable control circuit is configured to output a first turn-on signal or a first turn-off signal. In two adjacent shift register groups, a last-stage shift register in a present shift register group is electrically connected to a first-stage shift register in a next shift register group through a switching circuit.

15 Claims, 8 Drawing Sheets

(52) U.S. Cl.
CPC ............... *G09G 2300/0426* (2013.01); *G09G 2310/027* (2013.01); *G09G 2310/0286* (2013.01); *G09G 2310/0291* (2013.01); *G09G 2310/08* (2013.01)

(58) Field of Classification Search
CPC ... G09G 2310/0286; G09G 2310/0291; G09G 2310/08
See application file for complete search history.

(56) References Cited

U.S. PATENT DOCUMENTS

| | | | |
|---|---|---|---|
| 2004/0108989 A1* | 6/2004 | Gyouten | G09G 3/3677 345/100 |
| 2004/0130520 A1 | 7/2004 | Maeda et al. | |
| 2004/0257389 A1 | 12/2004 | Saito et al. | |
| 2005/0068287 A1 | 3/2005 | Lin et al. | |
| 2006/0092120 A1 | 5/2006 | Nose | |
| 2006/0114210 A1* | 6/2006 | Chen | G09G 3/3688 345/98 |
| 2006/0221015 A1* | 10/2006 | Shirasaki | G09G 3/325 345/77 |
| 2006/0274020 A1* | 12/2006 | Sung | G09G 3/3688 345/100 |
| 2007/0120781 A1 | 5/2007 | Choi | |
| 2007/0229438 A1 | 10/2007 | Shin | |
| 2009/0135169 A1* | 5/2009 | Hiratsuka | G09G 3/3688 345/208 |
| 2010/0245325 A1 | 9/2010 | Xiao et al. | |
| 2011/0228894 A1 | 9/2011 | Wang et al. | |
| 2016/0358586 A1 | 12/2016 | Song et al. | |
| 2017/0365203 A1 | 12/2017 | Takahashi | |
| 2018/0174554 A1 | 6/2018 | Hashimoto | |
| 2021/0350733 A1 | 11/2021 | Liu et al. | |

FOREIGN PATENT DOCUMENTS

| | | |
|---|---|---|
| CN | 1501706 A | 6/2004 |
| CN | 1766983 A | 5/2006 |
| CN | 1928635 A | 3/2007 |
| CN | 100514417 C | 7/2009 |
| CN | 101847378 A | 9/2010 |
| CN | 104637431 A | 5/2015 |
| CN | 106157873 A | 11/2016 |
| CN | 108335660 A | 7/2018 |
| CN | 110178174 A | 8/2019 |
| CN | 110910834 A | 3/2020 |
| EP | 0493820 A1 | 7/1992 |

* cited by examiner

SOURCE DRIVER, DISPLAY PANEL AND CONTROL METHOD THEREFOR, AND DISPLAY APPARATUS WITH ADJUSTABLE NUMBER OF DATA OUTPUT CHANNELS

CROSS-REFERENCE TO RELATED APPLICATION

This application is a national phase entry under 35 USC 371 of International Patent Application No. PCT/CN2020/132761, filed on Nov. 30, 2020, which claims priority to Chinese Patent Application No. 201911236632.7, filed on Dec. 5, 2019, which are incorporated herein by reference in their entirety.

TECHNICAL FIELD

The present disclosure relates to the field of display technologies, and in particular, to a source driver, a display panel and a control method therefor, and a display apparatus.

BACKGROUND

An organic light-emitting diode (OLED) display apparatus becomes one of mainstream display apparatuses in the display technologies field due to its characteristics of self-luminescence, high luminous efficiency, short effect time, wide application temperature range and the like. Depending on a driving mode, OLED display apparatuses are classified into two types: passive matrix organic light-emitting diode (PMOLED) display apparatuses and active matrix organic light-emitting diode (AMOLED) display apparatuses. AMOLED display apparatuses have characteristics of ultra-lightness and ultra-thinness, wide viewing angle, low power consumption, fast response, vivid color and the like, and are widely applied to display products such as mobile phones, televisions, tablets and the like. In addition, AMOLED is suitable for high-definition large-size display products due to its high luminous efficiency.

SUMMARY

In an aspect, a source driver is provided. The source driver includes a plurality of shift register groups cascaded in sequence, an enable control circuit, and at least one switching circuit.

Each shift register group includes a plurality of stages of shift registers cascaded in sequence. The shift register group is configured to sample digitized image data under a control of a first start signal. The first start signal of an n-th shift register group is output by an (n−1)-th shift register group, where n is a positive integer greater than 2.

The enable control circuit is configured to output a first turn-on signal or a first turn-off signal under a control of a level of an enable control signal from a timing controller.

The at least one switching circuit is electrically connected to the enable control circuit. In two adjacent shift register groups, a last-stage shift register in a present shift register group is electrically connected to a first-stage shift register in a next shift register group through a switching circuit. The switching circuit is configured to connect the present shift register group to the next shift register group under a control of the first turn-on signal from the enable control circuit, and disconnect the present shift register group and the next shift register group under a control of the first turn-off signal from the enable control circuit.

In some embodiments, the source driver further includes a plurality of digital-to-analog conversion circuit groups and a gating circuit.

Each digital-to-analog conversion circuit group corresponds to a shift register group. The digital-to-analog conversion circuit group is configured to convert digitized image data from the shift register group corresponding thereto into analog gray-scale signals according to gamma signals from a gray scale controller, and to output the analog gray-scale signals.

The gating circuit is electrically connected at least to the digital-to-analog conversion circuit groups. The gating circuit is configured to electrically connect to a first reference signal terminal, and is further configured to output analog gray-scale signals from the digital-to-analog conversion circuit group or to output a first reference signal transmitted by the first reference signal terminal in different periods.

In some embodiments, the gating circuit is further configured to electrically connect to a second reference signal terminal. The gating circuit is configured to output the analog gray-scale signals from the digital-to-analog conversion circuit group, or to output the first reference signal transmitted by the first reference signal terminal, or to output a second reference signal transmitted by the second reference signal terminal in different periods.

In some embodiments, a voltage of the first reference signal is greater than a minimum voltage of the analog gray-scale signals and less than a maximum voltage of the analog gray-scale signals.

In some embodiments, the source driver further includes a plurality of output buffer circuit groups. Each output buffer circuit group is electrically connected to the gating circuit, and the output buffer circuit group corresponds to a shift register group. Except for an output buffer circuit group corresponding to a first shift register group, remaining output buffer circuit groups are electrically connected to the enable control circuit.

In the at least one switching circuit, a switching circuit receiving the first turn-on signal output by the enable control circuit is a target switching circuit. A shift register group electrically connected to the target switching circuit and receiving the first start signal through the target switching circuit is a target shift register group.

The enable control circuit is further configured to in a case of outputting the first turn-on signal to the target switching circuit, output a second turn-on signal or a second turn-off signal to an output buffer circuit group corresponding to the target shift register group under the control of the level of the enable control signal from the timing controller.

The output buffer circuit group corresponding to the target shift register group is configured to output the analog gray-scale signals transmitted by the gating circuit or to output the first reference signal under a control of the second turn-on signal in different periods, and to stop operating under a control of the second turn-off signal.

The output buffer circuit group corresponding to a first shift register group is configured to output the analog gray-scale signals transmitted by the gating circuit or to output the first reference signal in different periods.

In some embodiments, the gating circuit is further configured to electrically connect to a second reference signal terminal. The output buffer circuit group corresponding to the target shift register group is configured to output the analog gray-scale signals transmitted by the gating circuit, or to output the first reference signal, or to output a second reference signal under a control of the second turn-on signal in different periods, and to stop operating under a control of the second turn-off signal.

The output buffer circuit group corresponding to the first shift register group is configured to output the analog gray-scale signals transmitted by the gating circuit, or to output the first reference signal, or to output the second reference signal in different periods.

In some embodiments, the source driver further includes a plurality of data latch circuit groups. Each data latch circuit group corresponding to a shift register group and a digital-to-analog conversion circuit group. The data latch circuit group is configured to store digitized image data from the shift register group corresponding thereto, and to output the stored digitized image data to the digital-to-analog conversion circuit group corresponding thereto under a control of a driving control signal.

In some embodiments, the data latch circuit group includes a plurality of data latch circuits, a number of data latch circuits included in each data latch circuit group is positively correlated with a number of shift registers included in the shift register group corresponding to the data latch circuit group.

In some embodiments, the source driver further includes a level conversion circuit electrically connected between the plurality of data latch circuit groups and the plurality of digital-to-analog conversion circuit groups. The level conversion circuit is configured to convert low-level digitized image data from the data latch circuit group into high-level digitized image data, and to output the high-level digitized image data to the digital-to-analog conversion circuit group corresponding to the data latch circuit group.

In some embodiments, the source driver further includes a data processor electrically connected to the plurality of shift register groups. The data processor is configured to preprocess digitized image data and to output the preprocessed digitized image data to the plurality of shift register groups.

In some embodiments, The source driver further includes a plurality of interface circuits electrically connected to the data processor. The interface circuits are configured to convert image data from the timing controller into the digitized image data, and to output the converted digitized image data to the data processor.

In some embodiments, each switching circuit includes a phase inverter, a first transmission gate and a second transmission gate.

The first transmission gate includes a first P-type transistor and a first N-type transistor. A gate of the first N-type transistor is electrically connected to an input terminal of the phase inverter and the enable control circuit, and a gate of the first P-type transistor is electrically connected to an output terminal of the phase inverter.

A last-stage shift register in the (n−1)-th shift register group is electrically connected to a first electrode of the first P-type transistor and a first electrode of the first N-type transistor in a switching circuit electrically connected thereto, and a first-stage shift register in the n-th shift register group is electrically connected to a second electrode of the first P-type transistor and a second electrode of the first N-type transistor in a switching circuit electrically connected thereto.

The second transmission gate includes a second P-type transistor and a second N-type transistor. A gate of the second P-type transistor is electrically connected to the input terminal of the phase inverter and the enable control circuit, and a gate of the second N-type transistor is electrically connected to the output terminal of the phase inverter.

The last-stage shift register in the (n−1)-th shift register group is further electrically connected to a first electrode of the second P-type transistor and a first electrode of the second N-type transistor in the switching circuit electrically connected thereto.

In another aspect, a display panel is provided. The display panel has a display area and a peripheral area. The display panel includes at least one source driver disposed in the peripheral area and a timing controller disposed in the peripheral area. Each source driver is the source driver described in any of the above embodiments.

The timing controller is electrically connected to the source driver. The timing controller is configured to transmit a first start signal to a first shift register group of a source driver, and to transmit the enable control signal to the enable control circuit of the source driver.

In some embodiments, the display panel includes a plurality of source drivers, and the plurality of source drivers are cascaded in sequence.

The switching circuit is configured to disconnect the present shift register group and the next shift register group under the control of the first turn-off signal from the enable control circuit, and to connect the present shift register group to a first shift register group of a next source driver.

In some embodiments, the display panel further includes a plurality of sub-pixels located in the display area and a plurality of data lines. Each sub-pixel includes a pixel driving circuit, and the source driver is electrically connected to the plurality of pixel driving circuits through at least one data line.

In another yet aspect, a display apparatus is provided. The display apparatus includes a display panel according to any one of the above embodiments.

In another yet aspect, a method for controlling a display panel is provided. The display panel includes a plurality of sub-pixels, at least one source driver, a timing controller and a gray scale controller. Each sub-pixel includes a pixel driving circuit. Each source driver is the source driver according to any one of the above embodiments, and the source driver further includes a gating circuit and a plurality of digital-to-analog conversion circuit groups. The gating circuit is electrically connected at least to the plurality of digital-to-analog conversion circuit groups and a first reference signal terminal.

A scanning time of a row of sub-pixels includes a data writing period and a blanking period. The method includes:
  outputting the first turn-on signal or the first turn-off signal to the switching circuit, by the enable control circuit of the source driver, under the control of the enable control signal from the timing controller;
  sampling digitized image data, by a shift register group of the source driver, under a control of a first start signal from the timing controller or a previous shift register group, and outputting the sampled digitized image data, by the shift register group;
  converting digitized image data from a shift register group corresponding to each digital-to-analog conversion circuit group into analog gray-scale signals, by the digital-to-analog conversion circuit group, according to gamma signals from the gray scale controller, and outputting the analog gray-scale signals, by the digital-to-analog conversion circuit group;
  during the data writing period, outputting the analog gray-scale signals from the digital-to-analog conversion circuit group, by the gating circuit; and receiving the analog gray-scale signals from the source driver, by the pixel driving circuit; and during the blanking period, outputting a first reference signal transmitted by the first reference signal terminal, by the gating circuit.

In some embodiments, the gating circuit further electrically connected to a second reference signal terminal. The scanning time of the row of sub-pixels further includes a threshold voltage compensation period. The method further includes:

during the threshold voltage compensation period, outputting a second reference signal transmitted by the second reference signal terminal, by the gating circuit; and receiving the second reference signal, by the pixel driving circuit, to compensate for a threshold voltage of a driving transistor in the pixel driving circuit.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description can be regarded as schematic diagrams, and are not limitations on actual dimensions of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, features defined by "first" and "second" may explicitly or implicitly include one or more of the features. In the description of the embodiments of the present disclosure, "a plurality of/the plurality of" means two or more unless otherwise specified.

In the description of some embodiments, the term "connected" and its extensions may be used. For example, the term "electrical connected" may be used when describing some embodiments to indicate that two or more components are in direct physical contact or electrical contact with each other.

The phrase "A and/or B" includes the following three combinations: only A, only B, and a combination of A and B.

The usage of "applicable to" or "configured to" herein means an open and inclusive language, which does not exclude apparatuses that are applicable to or configured to perform additional tasks or steps.

Figure 10:
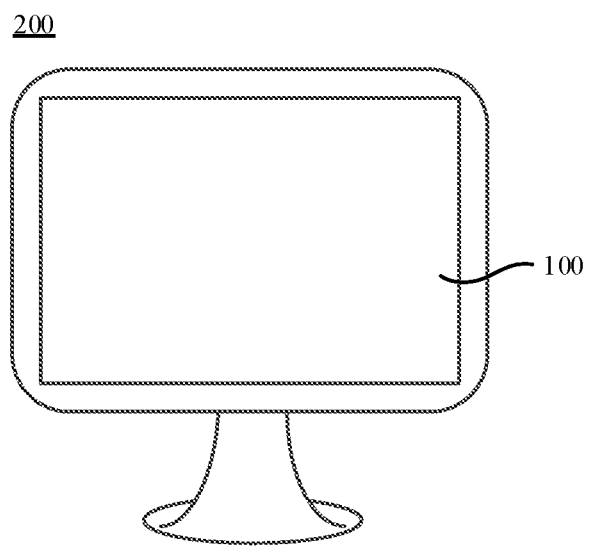
FIG. 10 is a diagram showing a structure of a display apparatus, in accordance with some embodiments of the present disclosure.

Embodiments of the present disclosure provide a display apparatus, as shown in FIG. 10, the display apparatus 200 includes a display panel 100.

In some embodiments, the display apparatus 200 further includes a frame, a circuit board, a display driver integrated circuit (IC) and other electronic accessories. The display panel 100 is disposed in the frame.

The display apparatus 200 provided by the embodiments of the present disclosure may be any device that displays images whether in motion (e.g., a video) or stationary (e.g., a static image), and whether textual or graphical. More specifically, it is anticipated that the described embodiments may be implemented in or associated with a variety of electronic devices. The variety of electronic devices may include (but are not limited to), for example, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, automobile displays (e.g., odometer displays), navigators, cockpit controllers and/or displays, camera view displays (e.g., rear view camera displays in vehicles), electronic photos, electronic billboards or signs, projectors, building structures, and packaging and aesthetic structures (e.g., a display for an image of a piece of jewelry).

The display panel 100 may be an AMOLED display panel.

Figure 1:
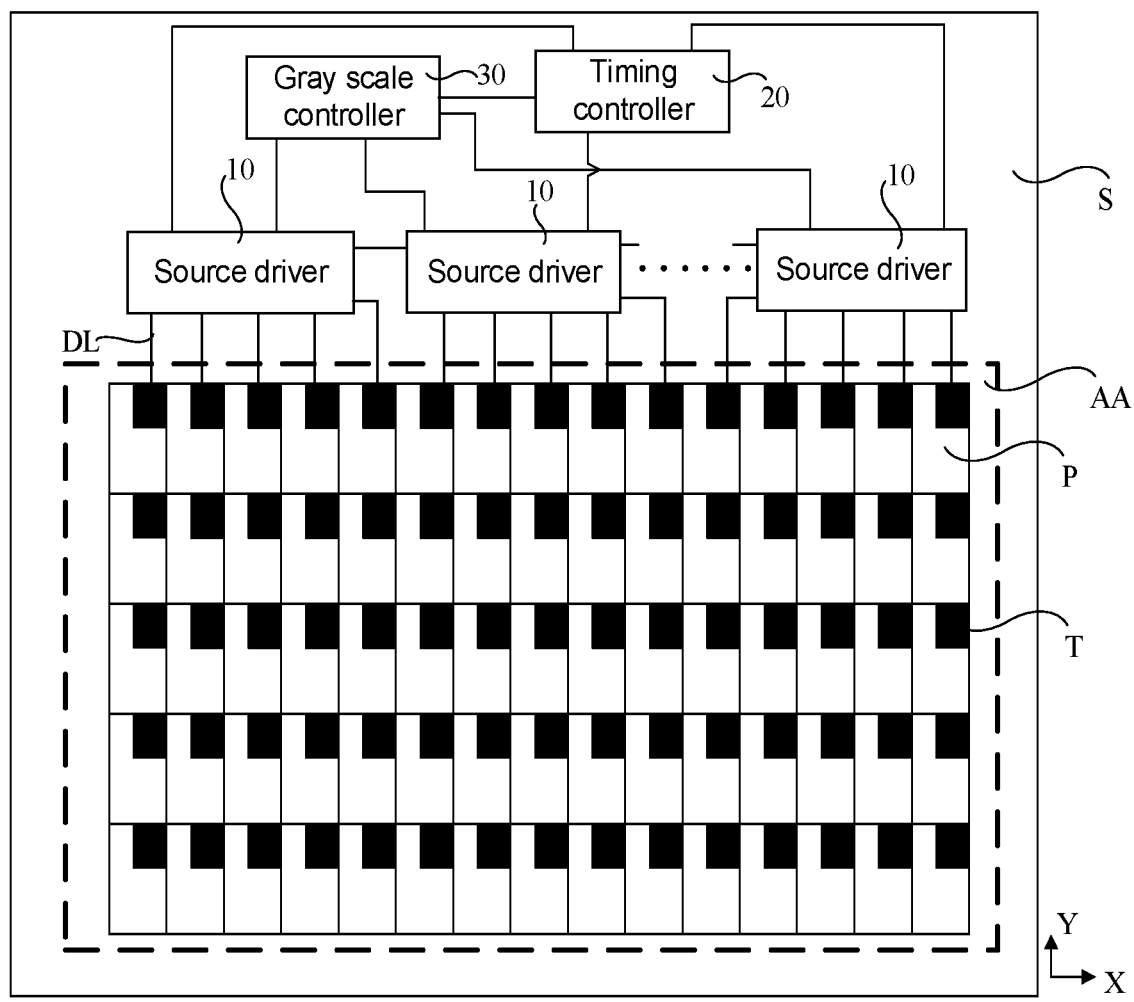
FIG. 1 is a diagram showing a structure of a display panel, in accordance with some embodiments of the present disclosure.

In some embodiments, as shown in FIG. 1, the display panel 100 has a display area AA (also referred to as an active display area) and a peripheral area S. For example, the peripheral area S may be disposed around the display area AA.

The display panel 100 includes a plurality of sub-pixels P and a plurality of data lines DL that are located in the display area AA. It will be noted that, FIG. 1 shows an example in which the plurality of sub-pixels P are arranged in an array, but the embodiments of the present disclosure are not limited thereto, and the plurality of sub-pixels P may also be arranged in other manners.

As shown in FIG. 1, each sub-pixel P includes a pixel driving circuit T.

Figure 2:
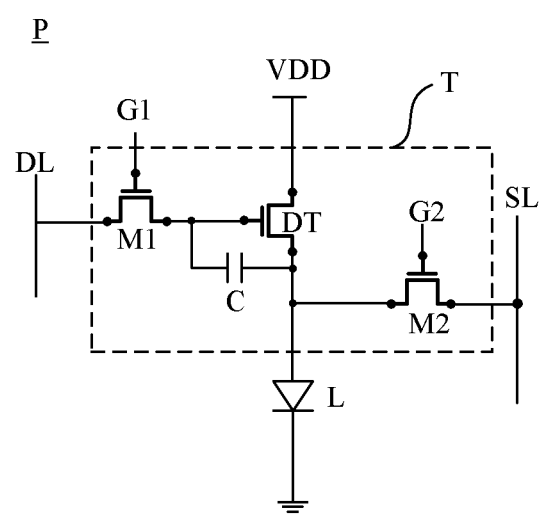
FIG. 2 is a diagram showing a structure of a pixel driving circuit, in accordance with some embodiments of the present disclosure.
Figure 3:
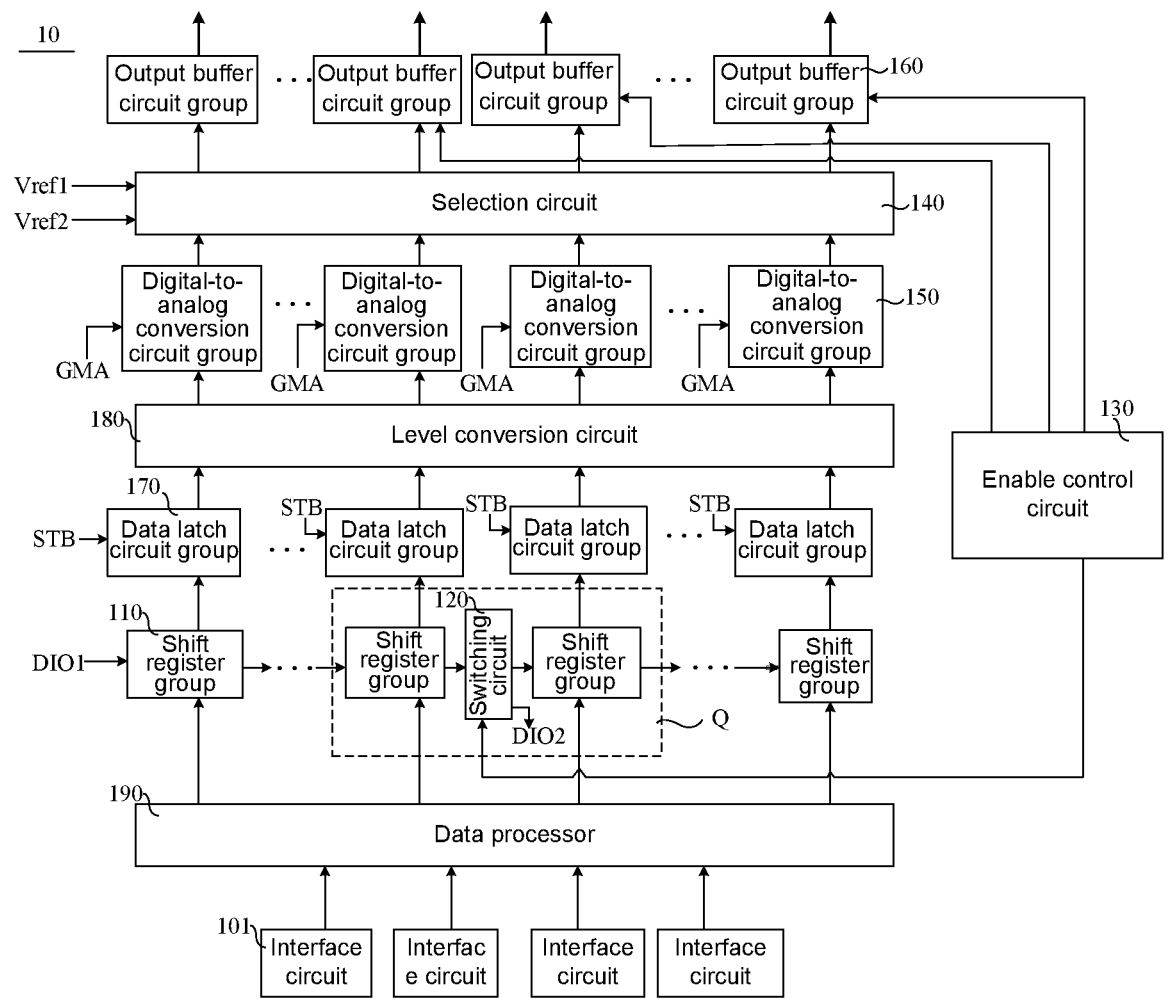
FIG. 3 is a diagram showing a structure of a source driver, in accordance with some embodiments of the present disclosure.

In some embodiments, as shown in FIG. 2, a light-emitting device L is further provided in the sub-pixel P, and the pixel driving circuit T is electrically connected to the light-emitting device L to drive the light-emitting device L to emit light. For example, the light-emitting device L is an OLED.

The pixel driving circuit T is generally composed of electronic devices such as thin film transistors (TFTs) and a capacitor (C). For example, as shown in FIG. 2, the pixel driving circuit T may be a pixel driving circuit of a 3T1C structure composed of three TFTs and a capacitor.

Furthermore, in some embodiments, as shown in FIG. 1, one or more source drivers 10 and a timing controller 20 are disposed in the peripheral area S of the display panel 100, and the timing controller 20 is electrically connected to each source driver 10.

Moreover, a source driver 10 is electrically connected to a plurality of pixel driving circuits T through one or more data lines DL. The source driver 10 is configured to receive digitized image data and process the digitized image data. A process of processing the digitized image data by the source driver 10 will be described below.

For example, each source driver 10 may be electrically connected to a plurality of pixel driving circuits T through a plurality of data lines DL, and an end of each data line DL is connected to a data output channel of the source driver 10 (i.e., an interface for outputting data to the data line DL), and the other end of each data line DL is electrically connected to pixel driving circuits T.

For example, as shown in FIG. 1, each source driver 10 is electrically connected to pixel driving circuits T in a plurality of columns of sub-pixels P through the plurality of data lines DL, and one data line DL is connected to pixel driving circuits T in a column of sub-pixels P.

An operation of the source driver 10 is controlled by the timing controller 20. If the display panel 100 includes one source driver 10, the timing controller 20 is configured to transmit a first start signal to the source driver 10, so as to control the source driver 10 to process the received digitized image data. If the display panel 100 includes a plurality of source drivers 10, and the plurality of source drivers 10 are cascaded in sequence, the timing controller 20 is configured to transmit a first start signal to a first source driver 10 in the plurality of cascaded source drivers 10, so as to control the source drivers 10 to process the received digitized image data.

In some embodiments, as shown in FIG. 1, a gray scale controller 30 is further disposed in the peripheral area S of the display panel 100, and the gray scale controller 30 is electrically connected to each source driver 10 and the timing controller 20.

The gray scale controller 30 is configured to output gamma signals to the source drivers 10 according to gray scale data of the sub-pixels in a display image from the timing controller 20.

Based on the above, embodiments of the present disclosure provide a source driver. As shown in FIGS. 3 to 8, the source driver 10 includes: a plurality of shift register groups 110 cascaded in sequence, at least one switching circuit 120, and an enable control circuit 130.

Figure 4:
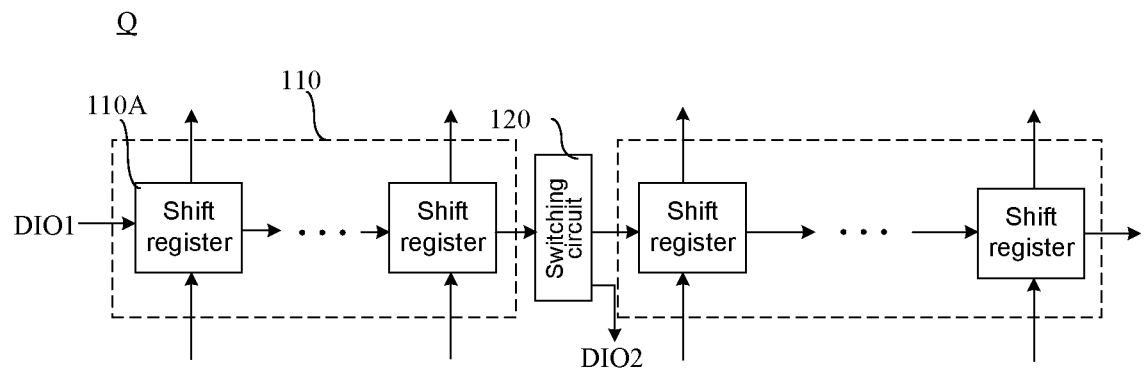
FIG. 4 is a partially enlarged schematic diagram of a portion Q in FIG. 3.

As shown in FIG. 4, each shift register group 110 includes a plurality of stages of shift registers 110A cascaded in sequence. The shift register group 110 is configured to sample digitized image data under a control of a first start signal DIO1 of the timing controller 20.

For example, the number of shift registers 110A in each shift register group 110 is the same.

For example, the number of shift registers 110A in each shift register group 110 is not exactly the same. For example, the number of shift registers 110A in at least one shift register group 110 is different from the number of shift registers 110A in other shift register groups 110.

Furthermore, the timing controller 20 is configured to transmit the first start signal DIO1 to a first shift register group of a source driver 10 to control the shift register group 110 of the source driver 10 to sample the digitized image data, and to transmit an enable control signal to enable control circuits 130 of the source drivers 10. If the display panel 100 includes one source driver 10, the timing controller 20 transmits the first start signal DIO1 to the first shift register group of the source driver 10. If the display panel 100 includes a plurality of source drivers 10, the timing controller 20 transmits the first start signal DIO1 to the first shift register group of one of the plurality of source drivers 10. For example, in a case where the plurality of source drivers 10 cascaded in sequence, the timing controller 20 transmits the first start signal to the first source driver 10.

It will be noted that, in a case where the display panel 100 includes the plurality of source drivers 10 cascaded in sequence, the first start signal DIO1 of the first shift register group in the first source driver comes from the timing controller 20, and, a second start signal DIO2 output by a previous source driver serves as a first start signal DIO1 of a first shift register group of each source driver except for the first source driver.

In addition, the last-stage of shift register in each shift register group 110 outputs the second start signal DIO2 after the sampling is finished, and the second start signal DIO2 serves as the first start signal DIO1 of the next shift register group. That is, the first start signal DIO1 of an n-th shift register group is output by an (n−1)-th shift register group, where n is a positive integer greater than 2.

The enable control circuit 130 is configured to output a first turn-on signal or a first turn-off signal under a control of the enable control signal from the timing controller 20. The first turn-on signal and the first turn-off signal are output to the switching circuit 120 for controlling a operation state of the switching circuit 120. The operation state of the switching circuit will be described below.

The first turn-on signal may be a high level signal, and the first turn-off signal may be a low level signal. Or, the first turn-on signal may be a low level signal, and the first turn-off signal may be a high level signal. The first turn-on signal or the first turn-off signal is the high level signal or the low level signal, depending on whether a level signal required for the operation state of the switching circuit 120 is the high level signal or the low level signal.

It will be noted that, the enable control signal received by the enable control circuit 130 from the timing controller 20 may be a high-level signal or a low-level signal depending on whether a level signal required for the enable control circuit 130 to output the first turn-on signal or the first turn-off signal is a high level signal or a low level signal. According to the above, the first turn-on signal and the first turn-off signal are used to control the operation state of the switching circuit 120, and the operation state of the switching circuit 120 is related to the number of shift register groups 110 for sampling (described below). Moreover, the larger the number of shift register groups 110 for sampling, the larger the number of data output channels of the source driver 10, and the greater the resolution of the display panel 100. Therefore, whether the enable control signal is the high-level signal or the low-level signal is related to factors such as the resolution of the display panel 100 and the number of data output channels of the source driver 10.

Each switching circuit 120 is electrically connected to the enable control circuit 130. As shown in FIG. 4, in two adjacent shift register groups 110, the last-stage shift register in a present shift register group is electrically connected to the first-stage shift register in a next shift register group through a switching circuit 120.

The switching circuit 120 is configured to connect the present shift register group to the next shift register group under a control of the first turn-on signal from the enable control circuit 130, so as to transmit the second start signal DIO2 output by the present shift register group to the next shift register group as the first start signal DIO1 of the next shift register group (this is an operation state of the switching circuit 120); and to disconnect the present shift register group and the next shift register group under a control of the first turn-off signal from the enable control circuit 130 (this is the other operation state of the switching circuit 120).

It may be understood that, in a case where there is one switching circuit 120, the switching circuit 120 may be located between any pair of adjacent shift register groups (as shown in FIG. 4). That is, the last-stage shift register in the (n−1)-th shift register group and the first-stage shift register in the n-th shift register group are cascaded through a switching circuit 120. In this case, the first to (n−1)-th shift register group are sequentially cascaded, and the n-th to the last shift register group are sequentially cascaded.

Figure 5:
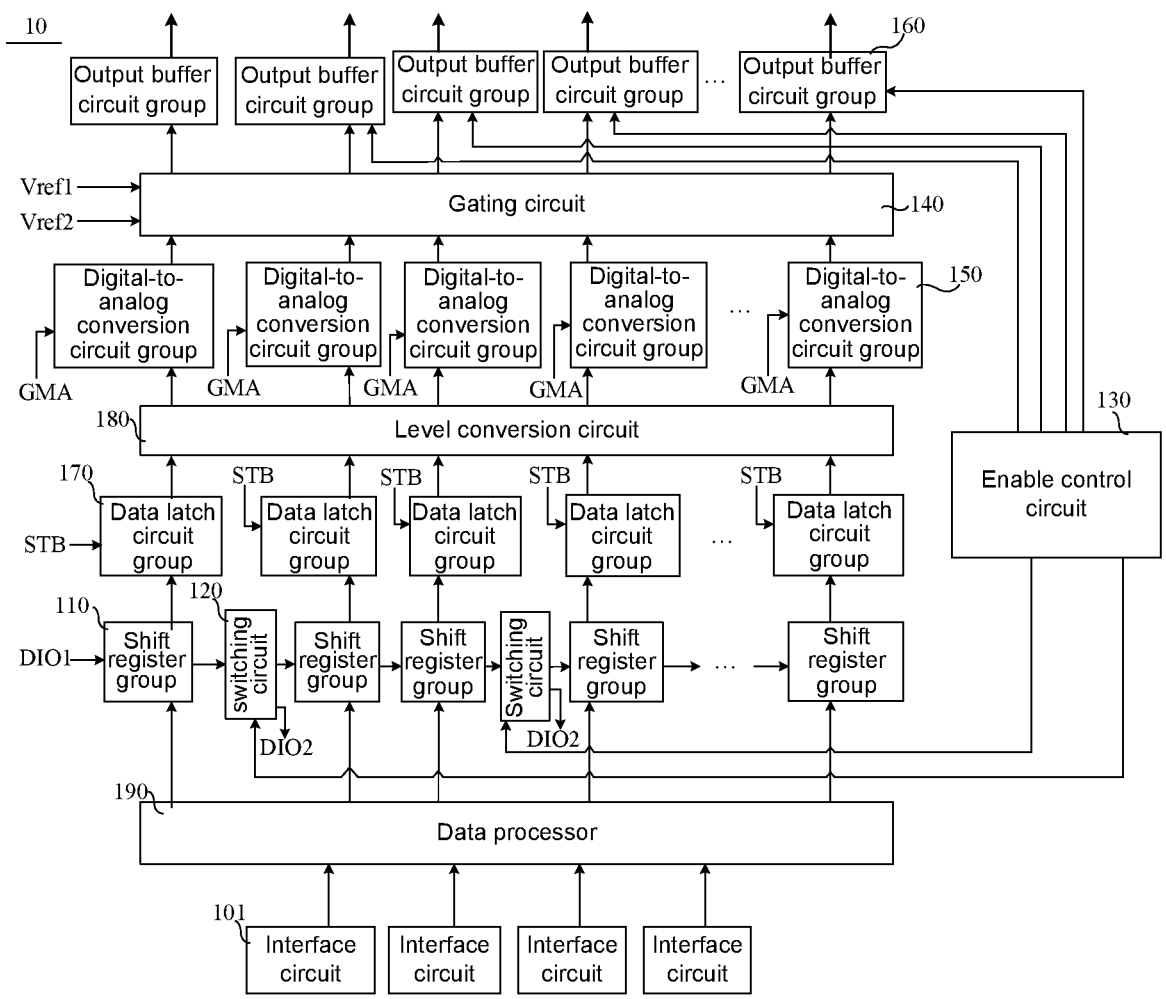
FIG. 5 is a diagram showing a structure of another source driver, in accordance with some embodiments of the present disclosure.

In a case where there are a plurality of switching circuits 120, the last-stage shift register in an odd-numbered shift register group may be electrically connected to the first-stage shift register in an even-numbered shift register group adjacent thereto through a switching circuit 120. For example, as shown in FIG. 5, a shift register group, at the far left side, of the plurality of shift register groups 110 is the first shift register group, and a shift register group, at the far right side, of the plurality of shift register groups 110 is the last shift register group. The last-stage shift register in the first shift register group 110 is electrically connected to the first-stage shift register in a second shift register group through a switching circuit 120, and the last-stage shift register in the second shift register group is directly connected to the first-stage shift register in a third shift register group.

Figure 6:
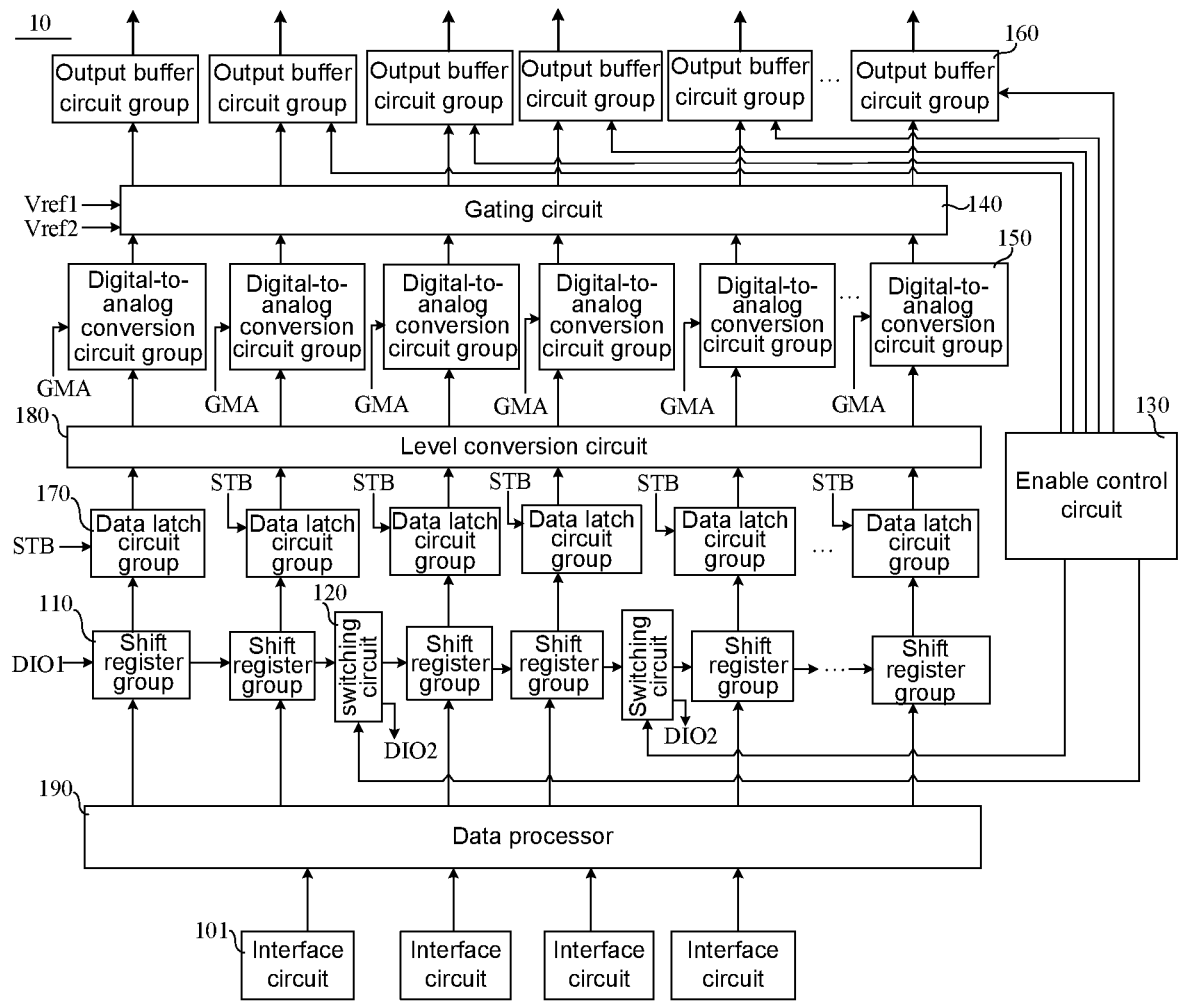
FIG. 6 is a diagram showing a structure of yet another source driver, in accordance with some embodiments of the present disclosure.

Or, the last-stage shift register in an even-numbered shift register group may be electrically connected to the first-stage shift register in an odd-numbered shift register group adjacent thereto through a switching circuit 120. For example, as shown in FIG. 6, a shift register group, at the far left side, of the plurality of shift register groups 110 is the first shift register group, and a shift register group, at the far right side, of the plurality of shift register groups 110 is the last shift register group. The last-stage shift register in the second shift register group 110 is electrically connected to the first-stage shift register in a third shift register group through a switching circuit 120, and the last-stage shift register in the first shift register group is directly connected to the first-stage shift register in the second shift register group.

Figure 7:
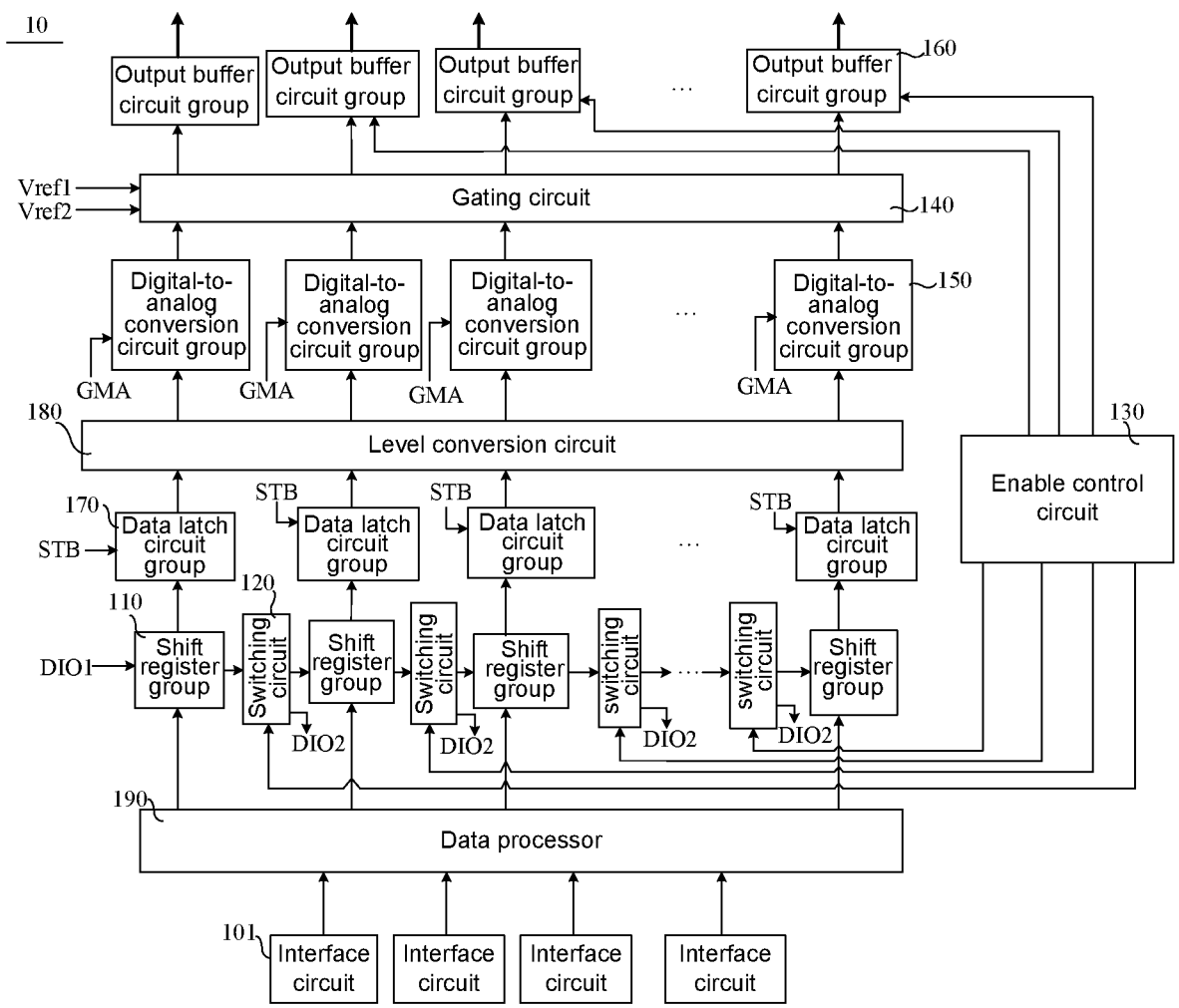
FIG. 7 is a diagram showing a structure of yet another source driver, in accordance with some embodiments of the present disclosure.
Figure 8:
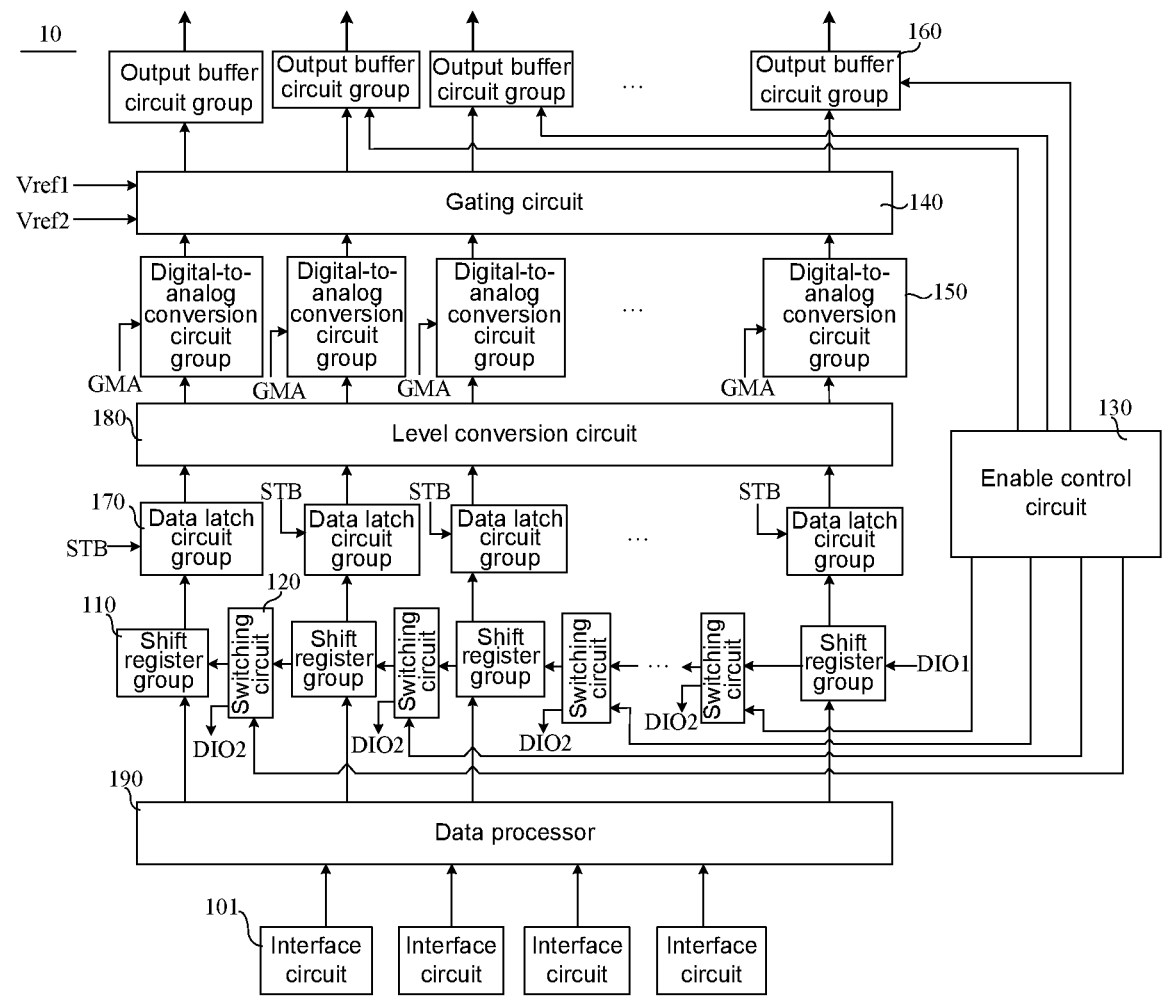
FIG. 8 is a diagram showing a structure of yet another source driver, in accordance with some embodiments of the present disclosure.

Or, as shown in FIGS. 7 and 8, in any two adjacent shift register groups 110, the last-stage shift register in a present shift register group is electrically connected to the first-stage shift register in a next shift register group 120 through a switching circuit.

It may be understood that, except for the first shift register group, each of the remaining shift register groups may be cascaded with a previous shift register group through a switching circuit 120.

Based on this, the (n−1)-th shift register group samples the digitized image data under the control of the first start signal DIO1, and the last stage shift register in the n-th shift register group outputs the sampled digitized image data and outputs the second start signal DIO2.

If the signal from the enable control circuit 130 received by the switching circuit 120 between the (n−1)-th shift register group and the n-th shift register group is the first turn-on signal, the switching circuit 120 transmits the second start signal DIO2 output by the (n−1)-th shift register group to the n-th shift register group as the first start signal DIO1 of the n-th shift register group under the control of the first turn-on signal, so as to control the n-th shift register group to sample the digitized image data.

In a source driver 10, if the signal from the enable control circuit 130 received by the switching circuit 120 between the (n−1)-th shift register group and the n-th shift register group is the first turn-off signal, the switching circuit 120 transmits the second start signal DIO2 output by the (n−1)-th shift register group to a first shift register group in a next-stage source driver cascaded with the source driver 10 under the control of the first turn-off signal as the first start signal DIO1 of the first shift register group in the next-stage source driver.

It may be understood that, in the case where the display panel 100 includes the plurality of source drivers 10 cascaded in sequence, except the first-stage source driver, each source driver uses the second start signal DIO2 output from the previous-stage source driver as the first start signal DIO1 of the first shift register group in the source driver.

For example, under the control of the first turn-off signal, a switching circuit 120 between a first shift register group and a second shift register group in a source driver 10 transmits the second start signal DIO2 output by the first shift register group to a first shift register group in a next-stage source driver 10 cascaded with the source driver 10 instead of the second shift register group as the first start signal DIO1 of the first shift register group in the next-stage source driver 10. In this case, the second to the last shift register group in the source driver 10 all do not operate, and the first shift register group in the next-stage source driver 10 starts sampling. In a case where the first to the last shift register group in the source driver 10 all perform sampling, the switching circuits 120 in the source driver 10 are all in a turn-on state, and the last shift register group outputs a second start signal DIO2 as a first start signal DIO1 of the first shift register group in the next-stage source driver when sampling is finished, so that the shift register groups in the next-stage source driver performs sampling step by step.

In some examples, a source driver includes a plurality of shift registers, and sampling is performed through the plurality of shift registers, and the number of data output channels of the source driver is constant. In the embodiments of the present disclosure, the source driver includes a plurality of shift register groups 110, and each shift register group 110 includes a plurality of shift registers (it can be understood that the source driver in the examples includes only one shift register group). The number of shift register groups 110 perform sampling may be selected through the switching circuit 120, so as to adjust the number of data output channels of the source driver 10. When the resolution of the display panel 100 is large, more shift register groups 110 are turned on to increase the data output channels of the source driver 10; when the resolution of the display panel 100 is small, less shift register groups 110 are turned on, to reduce the data output channels of the source driver 10, so that the source driver 10 may be adapted to display panels 100 with various resolutions.

For example, in a case where there are shift registers of twenty-four stages in each shift register group 110, the first shift register group performs sampling sequentially from the first-stage shift register to the twenty-fourth-stage shift register and serially outputs twenty-four sampled digitized image data under the control of the first start signal DIO1 from the timing controller 20, and the twenty-fourth-stage shift register outputs the second start signal DIO2 as the first start signal DIO1 of the second shift register group after outputting the sampled digitized image data.

Furthermore, a switching circuit 120 located between the twenty-fourth-stage shift register in the first shift register group and the first-stage shift register in the second shift register group is turned on under a control of a first turn-on signal, and transmits the second start signal DIO2 output from the first shift register group as the first start signal DIO1 of the second shift register group to the first-stage shift register in the second shift register group, so that the second shift register group performs sampling sequentially from the first-stage shift register to the twenty-fourth-stage shift register and serially outputs twenty-four sampled digitized image data, and the twenty-fourth-stage shift register outputs the second start signal DIO2 as the first start signal DIO1 of the third shift register group after outputting the sampled digitized image data.

Based on this, if a switching circuit 120 located between the twenty-fourth-stage shift register in the second shift register group and the first-stage shift register in the third shift register group receives a first turn-off signal, the third shift register group will not receive the second start signal DIO2 output by the second shift register group as the first start signal DIO1 of the third shift register group. That is, the third shift register group does not operate, and the third shift register group to the last shift register group do not operate. Only the first shift register group and the second shift register group in the source driver 10 operate, and output forty-eight sampled digitized image data. Therefore, the number of shift register groups for sampling may be selected through the switching circuit 120. In a case where n shift register groups are selected for sampling, and each shift register group includes m shift registers (m being a positive integer greater than 1), the source driver 10 may output m times n sampled digitized image data.

It will be noted that, the first shift register group and the last shift register group are relative concepts, and the first shift register and the last shift register in the shift register group 110 are also relative concepts, which both are determined according to a forward sampling and a reverse sampling of the shift register groups.

For example, when a shift direction switching signal (SHL) received by the source driver 10 from the timing controller 20 is at a high level, shift register groups in the source driver 10 in FIG. 7 perform the forward sampling sequentially from the first shift register group to the last shift register group. That is, the shift register groups 110 in FIG. 7 perform sampling from left to right. In this case, the first-stage shift register in the first shift register group receives the first start signal DIO1 from the timing controller 20, and the last-stage shift register in the first shift register group outputs the second start signal DIO2 as the first start signal DIO1 of the second shift register group.

For another example, when the SHL is at a low level, shift register groups in the source driver 10 in FIG. 8 perform the reverse sampling sequentially from the last shift register group to the first shift register group. That is, the shift register groups 110 in FIG. 8 perform sampling from right to left. In this case, the last-stage shift register in the last shift register group may be regarded as the first-stage shift register in the first shift register group in the example above mentioned to receive the first start signal DIO1 from the timing controller 20, and the first-stage shift register in the last shift register group may be regarded as the last-stage shift register in the first shift register group in the example above mentioned to output the second start signal DIO2.

In summary, in the above embodiments of the present disclosure, the source driver 10 includes the plurality of shift register groups 110 cascaded in sequence, the at least one switching circuit 120, and the enable control circuit 130, and each shift register group 110 includes the plurality of stages of shift registers cascaded in sequence. In two adjacent shift register groups 110, the last-stage shift register in the present shift register group is electrically connected to the first-stage shift register in the next shift register group through the switching circuit 120, the switching circuit 120 may be controlled to be turned on or turned off by a first turn-on signal or a first turn-off signal output by the enable control circuit 130, so as to control the present shift register group to be connected or disconnected to the next shift register group. Therefore, the number of the shift register groups 110 for sampling may be selected by controlling the operation state of the switching circuit 120, so as to adjust the number of the data output channels of the source driver 10. When the resolution of the display panel 100 is large, more shift register groups 110 is turned on to increase the data output channels of the source driver 10; when the resolution of the display panel 100 is small, less shift register groups 110 are turned on to reduce the data output channels of the source driver 10, so that the source driver 10 may be adapted to display panels 100 with various resolutions to improve compatibility of the source driver 10.

In some embodiments, as shown in FIG. 3, and FIGS. 5 to 8, the source driver 10 further includes a gating circuit 140 and a plurality of digital-to-analog conversion circuit groups 150.

A digital-to-analog conversion circuit group 150 corresponds to a shift register group 110.

It may be understood that, the numbers of the digital-to-analog conversion circuit groups 150 and the shift register groups 110 are the same.

The digital-to-analog conversion circuit group 150 is configured to convert the digitized image data from the shift register group 110 corresponding thereto into analog gray-scale signals according to gamma signals GMA from the gray scale controller 30 and output them.

The gating circuit 140 is electrically connected at least to the digital-to-analog conversion circuit groups 150 and a first reference signal terminal Vref1. The gating circuit 140 is configured to output analog gray-scale signals from the digital-to-analog conversion circuit groups 150 or to output a first reference signal transmitted by the first reference signal terminal Vref1 in different periods.

In some embodiments, the display panel 100 further includes a power supply circuit. The power supply circuit is used to provide power to a plurality of components in the display panel 100 (components such as the source driver 10, the timing controller 20 and the gray scale controller 30). Therefore, the above first reference signal may be provided by the power supply circuit.

In some embodiments, the digital-to-analog conversion circuit group 150 includes a plurality of digital-to-analog conversion circuits, and the number of the digital-to-analog conversion circuits included in each digital-to-analog conversion circuit group 150 is positively correlated with the number of the shift registers included in the shift register group 110 corresponding to the digital-to-analog conversion circuit group 150. For example, the number of the digital-to-analog conversion circuits included in each digital-to-analog conversion circuit group 150 is an integer multiple of the number of the shift registers included in the shift register group 110 corresponding to the digital-to-analog conversion circuit group 150.

A scanning time of a row of sub-pixels P includes a data writing period and a blanking period. Accordingly, in the data writing period, the gating circuit 140 outputs the analog gray-scale signals from the digital-to-analog conversion circuit groups 150 to enable the pixel driving circuits T to write data. In the blanking period, the gating circuit 140 outputs the first reference signal to precharge the data lines DL, so that voltages of signals on the data lines DL are equal to a voltage of the first reference signal.

In some embodiments, the voltage of the first reference signal is greater than a minimum voltage of the analog gray-scale signals and less than a maximum voltage of the analog gray-scale signals. That is, the voltage of the first reference signal is between the maximum value and the minimum value of the voltages of the analog gray-scale signals.

It may be understood that, a range between the minimum value and the maximum value of the voltages of the analog gray-scale signals may be referred to as an amplitude range of voltages of the analog gray-scale signals.

For example, the amplitude range of the voltages of the analog gray scale signals is 0 V to 12V, and the voltage of the first reference signal is 5 V, which is between 0 V to 12V.

In a case where the data lines DL are not precharged, a time required for the voltage of the signal in each data line DL to change to the maximum, i.e., a time required for the voltage of the signal in each data line DL to change from 0V to 12V, is a maximum inversion time. Compared to the above, in the embodiments of the present disclosure, during the blanking period of the row of sub-pixels P, the data lines DL are precharged, so that the voltage of the signal on each data line DL is 5 V. When the analog gray-scale signals of the digital-to-analog conversion circuit groups 150 are transmitted to the data lines DL, the maximum change of the voltage of the signal in each data line DL is from 5V to 12V, that is, a time required for the voltage change of the signal in each data line DL from 5V to 12V is a maximum inversion time. Since the range of the maximum voltage change of the signal in each data line DL is reduced, the time for the maximum inversion of the voltage of the signal in each data line DL in the display panel 100 is shortened, so that a refresh frequency of the display panel is increased.

In some embodiments, as shown in FIG. 3 and FIGS. 5 to 8, the gating circuit 140 is electrically connected to output terminals of the digital-to-analog conversion circuit groups 150, the first reference signal terminal Vref1 and a second reference signal terminal Vref2.

The gating circuit 140 is configured to output analog gray-scale signals from the digital-to-analog conversion circuit groups 150, or the first reference signal transmitted by the first reference signal terminal Vref1, or the second reference signal transmitted by the second reference signal terminal Vref2 in different periods. The second reference signal may be provided by the above power supply circuit.

In a case where the gating circuit 140 is further electrically connected to the second reference signal terminal Vref2, the scanning time of the row of sub-pixels P further includes a threshold voltage compensation period. In the threshold voltage compensation period, the gating circuit 140 outputs the second reference signal. In this case, the pixel driving circuit T may perform threshold voltage compensation on a driving transistor in the pixel driving circuit T according to the second reference signal.

It will be noted that, the gating circuit 140 receives a plurality of signals (i.e., the analog gray scale signals, the first reference signal, and the second reference signal), and outputs one of the received the plurality of signals in a certain period, so as to achieve a selection function of the gating circuit 140. Based on this, any circuit that may achieve the selection function may be used as the gating circuit 140 in the embodiments of the present disclosure. A specific structure of the gating circuit 140 is not limited in the embodiments of the present disclosure, and those skilled in the art may set it according to the actual situation.

Furthermore, the source driver 10 further includes a bandgap reference circuit. The bandgap reference circuit is electrically connected to the power supply circuit to receive the first reference signal or the second reference signal transmitted by the power supply circuit. In addition, the bandgap reference circuit is further electrically connected to the first reference signal terminal Vref1 and the second reference signal terminal Vref2, and the bandgap reference circuit is configured to provide the first reference signal and the second reference signal to the gating circuit 140 through the first reference signal terminal Vref1 and the second reference signal terminal Vref2, respectively.

In some embodiments, as shown in FIG. 3 and FIGS. 5 to 8, the source driver 10 further includes a plurality of output buffer circuit groups 160.

Each output buffer circuit group 160 is electrically connected to the gating circuit 140, and an output buffer circuit group 160 corresponds to a shift register group 110. Except for an output buffer circuit group 160 corresponding to the first shift register group, remaining output buffer circuit groups 160 are electrically connected to the enable control circuit 130.

It may be understood that, the number of the output buffer circuit groups 160 is the same as the number of the digital-to-analog conversion circuit groups 150. An output terminal of an output buffer circuit group 160 is electrically connected to a data line DL.

In some embodiments, each output buffer circuit group 160 includes a plurality of output buffer circuits, and the number of the output buffer circuits included in each output buffer circuit group 160 is positively correlated with the number of the shift registers included in the shift register group 110 corresponding to the output buffer circuit group 160. For example, the number of the output buffer circuits included in each output buffer circuit group 160 is an integer multiple of the number of the shift registers included in the shift register group 110 corresponding to the output buffer circuit group 160.

It will be noted that, in all the shift register groups 110 included in the source driver 10, it is not necessary for each shift register group 110 to receive the first start signal DIO1 through a switching circuit 120. Hereinafter, a switching circuit, in the at least one switching circuit, receiving the first turn-on signal output by the enable control circuit 130 is referred to as a target switching circuit. A shift register group 110 connected to the target switching circuit and receiving the first start signal DIO1 through the target switching circuit is referred to as a target shift register group.

The enable control circuit 130 is further configured to, in a case of outputting the first turn-on signal to the target switching circuit, output the second turn-on signal or the second turn-off signal to the output buffer circuit group 160 corresponding to the target shift register group under the control of the enable control signal from the timing controller 20.

The output buffer circuit group 160 corresponding to the target shift register group is configured to output analog gray-scale signals transmitted by the gating circuit 140 or the first reference signal in different periods under the control of the second turn-on signal, and to stop operating under the control of the second turn-off signal, that is, the output buffer circuit group 160 stop outputting signals transmitted by the gating circuit 140.

For example, during the data writing period of the row of sub-pixels P, the output buffer circuit group 160 corresponding to the target shift register group output analog gray-scale signals under the control of the second turn-on signal; during the blanking period of the row of sub-pixels P, the output buffer circuit group 160 corresponding to the target shift register group output the first reference signal under the control of the second turn-on signal.

The output buffer circuit group 160 corresponding to the first shift register group is configured to output analog gray-scale signals transmitted by the gating circuit 140 or output the first reference signal in different periods. It will be noted that, the output buffer circuit group 160 corresponding to the first shift register group is not electrically connected to the enable control circuit 130, so it is not controlled by the signal output by the enable control circuit 130.

For example, during the data writing period of the row of sub-pixels P, the output buffer circuit group 160 corresponding to the first shift register group outputs analog gray-scale signals; during the blanking period of the row of sub-pixels P, the output buffer circuit group 160 corresponding to the first shift register group outputs the first reference signal.

It will be noted that, the second turn-on signal or the second turn-off signal received by the output buffer circuit group 160 is related to the first turn-on signal or the first turn-off signal received by the target switching circuit 120 electrically connected to the target shift register group 110 corresponding to the output buffer circuit group 160. In some embodiments, since the output buffer circuit groups 160 operates at a side of the source driver 10 with a high voltage, and the switching circuits 120 operates at a side of the source driver 10 with a low voltage, a voltage of the first turn-on signal may be set lower than a voltage of the second turn-on signal, and a voltage of the first turn-off signal is lower than a voltage of the second turn-off signal, so as to ensure that both the output buffer circuit groups 160 and the switching circuits 120 may be effectively turned on or turned off.

It may be understood that, when a shift register group 110 receives the first start signal DIO1 through a switching circuit 120 and is in an operation state, an output buffer circuit group 160 corresponding to the shift register group 110 also starts to operate; when the shift register group 110 does not receive the first start signal DIO1 through a switching circuit 120 and is not in an operation state, the output buffer circuit group 160 corresponding to the shift register group 110 also does not operate.

For example, the switching circuit 120 electrically connected to the first-stage shift register in the second shift register group receives the first turn-on signal, and the output buffer circuit group 160 corresponding to the second shift register group receives the second turn-on signal, that is, the second shift register group operates, and the output buffer circuit group 160 corresponding to the second shift register group operates. The switching circuit 120 electrically connected to the first-stage shift register in the second shift register group receives the first turn-off signal, and the output buffer circuit group 160 corresponding to the second shift register group receives the second turn-off signal, that is, the second shift register group does not operate, and the output buffer circuit group 160 corresponding to the second shift register group operates.

Furthermore, the source driver 10 may turn on or turn off the shift register group(s) 110 through the switching circuit(s) 120, and the output buffer circuit group(s) 160 corresponding to the shift register group(s) 110 are turned on or turned off accordingly, thereby adjusting the number of data output channels of the source driver 10 to adapt to the display panel 100 of various resolutions. In addition, when the shift register group(s) 110 that do not need to operate are in a turned-off state due to an action of the switching circuit(s) 120, the corresponding output buffer circuit group(s) 160 may not operate under the control of the second turn-off signal, so that the output buffer circuit group(s) 160 do not need to maintain the operation state all the time, thereby reducing the power consumption of the source driver 10.

Moreover, the output buffer circuit groups 160 may improve a driving capability of the source driver 10, i.e., a load capability of the source driver 10.

In some embodiments, in the case where the gating circuit 140 is further electrically connected to the second reference signal terminal Vref2, the output buffer circuit group 160 corresponding to the target shift register group is configured to output the analog gray-scale signals transmitted by the gating circuit 140, or output the first reference signal, or output the second reference signal in different periods under the control of the second turn-on signal; and configured to stop operating under the control of the second turn-off signal. In addition, in the case where the gating circuit 140 is further electrically connected to the second reference signal terminal Vref2, the scanning time of the row of sub-pixels P as described hereinbefore further includes a threshold voltage compensation period.

For example, during the data writing period of the row of sub-pixels P, the output buffer circuit group 160 corresponding to the target shift register group outputs analog gray-scale signals under the control of the second turn-on signal; during the blanking period of the row of sub-pixels P, the output buffer circuit group 160 corresponding to the target shift register group outputs the first reference signal under the control of the second turn-on signal; and during the threshold voltage compensation period of the row of sub-pixels P, the output buffer circuit group 160 corresponding to the target shift register group outputs the second reference signal under the control of the second turn-on signal.

The output buffer circuit group 160 corresponding to the first shift register group is configured to output analog gray-scale signals transmitted by the gating circuit 140, or output the first reference signal, or output the second reference signal in different periods.

For example, during the data writing period of the row of sub-pixels P, the output buffer circuit group 160 corresponding to the first shift register group outputs analog gray-scale signals; during the blanking period of the row of sub-pixels P, the output buffer circuit group 160 corresponding to the first shift register group outputs the first reference signal; and during the threshold voltage compensation period of the row of sub-pixels P, the output buffer circuit group 160 corresponding to the first shift register group outputs the second reference signal.

In some embodiments, as shown in FIG. 3 and FIGS. 5 to 8, the source driver 10 further includes a plurality of data latch circuit groups 170.

A data latch circuit group 170 corresponds to a shift register group 110 and a digital-to-analog conversion circuit group.

It may be understood that, the number of the data latch circuit groups 170 is the same as the number of the shift register groups 110.

The data latch circuit group 170 is configured to store digitized image data from the shift register group 110 corresponding thereto, and output the stored digitized image data to the digital-to-analog conversion circuit group 150 corresponding thereto under the control of a driving control signal STB. The driving control signal STB may be provided by the timing controller 20.

It will be noted that, the output of the data latch circuit group 170 is a parallel output. It may be understood that, since the shift registers in the shift register group 110 sequentially sample and output the digitized image data, that is, the output of the shift register group 110 is a serial output, and accordingly the data latch circuit group 170 sequentially latch the digitized image data output by the corresponding shift register group 110.

In some embodiments, each data latch circuit group 170 includes a plurality of data latch circuits, and the number of the data latch circuits included in each data latch circuit group 170 is positively correlated with the number of the shift registers included in the shift register group 110 corresponding to the data latch circuit group 170.

For example, the number of the data latch circuits in the data latch circuit group 170 may be a product of the number the of shift registers in the shift register group 110 corresponding to the data latch circuit group 170 and a data capacity sampled by the shift register group 110. For example, if the data capacity sampled by the shift register group 110 is 80 bits, and the shift register group 110 includes 24 shift registers, the corresponding data latch circuit group 170 includes at least 1920 data latch circuits. In this case, if the data is transmitted with 10 bits, there are 192 output channels corresponding to the shift register group 110 and the data latch circuit group 170.

In some embodiments, as shown in FIG. 3 and FIGS. 5 to 8, the source driver 10 further includes a level conversion circuit 180. The level conversion circuit 180 is electrically connected between the plurality of data latch circuits group 170 and the plurality of digital-to-analog conversion circuit groups 150.

The level conversion circuit 180 is configured to convert low-level digitized image data from a data latch circuit group 170 into high-level digitized image data, and output the high-level digitized image data to a digital-to-analog conversion circuit group 150 corresponding to the data latch circuit group 170.

It will be noted that, the output of the level conversion circuit 180 is a parallel output.

It may be understood that, the level conversion circuit 180 converts the low-level digitized image data into high-level digitized image data, so as to be suitable for a voltage of the driving transistor in the pixel driving circuit T.

In some embodiments, as shown in FIG. 3 and FIGS. 5 to 8, the source driver 10 further includes a data processor 190.

The data processor 190 is electrically connected to the plurality of shift register groups 110.

The data processor 190 is configured to preprocess the digitized image data from the timing controller 20 and output the preprocessed digitized image data to the plurality of shift register groups 110.

For example, the pre-processing includes data reverse processing, serial-to-parallel conversion processing, and implementing a data swap function and the like, on the digitized image data.

It may be understood that, the data processor 190 processes digital signals, compared with arranging the data processor 190 at an input terminal of the output buffer circuit group 160 to process analog signals, the data processor 190 is arranged at an input terminal of the shift register group 110 in the embodiments of the present disclosure, and the speed and accuracy of signal processing may be improved. In addition, arranging the data processor 190 in a low-voltage region may reduce an area of the transistors and reduce a size of the source driver 10 compared to arranging the data processor 190 in a high-voltage region.

Based on this, in some embodiments, as shown in FIG. 3 and FIGS. 5 to 8, the source driver 10 further includes a plurality of interface circuits 101.

The plurality of interface circuits 101 are electrically connected to the data processor 190.

The interface circuit 101 is configured to convert image data from the timing controller 20 into digitized image data, and output the converted digitized image data to the data processor 190.

It may be understood that, in a case where the plurality of sub-pixels P include at least first color sub-pixels, second color sub-pixels and third color sub-pixels, and the number of interface circuits 101 corresponding to each color sub-pixels is N, the number of interface circuits 101 is 3N, and N is a positive integer. N interface circuits 101 are used to receive image data to be displayed by the first color sub-pixels, another N interface circuits 101 are used to receive image data to be displayed by the second color sub-pixels, and the remaining N interface circuits 101 are used to receive image data to be displayed by the third color sub-pixels. For example, the first color, the second color and the third color are three primary colors.

Similarly, in a case where the plurality of sub-pixels further include fourth color sub-pixels, the number of interface circuits 101 is 4N. N interface circuits 101 are used to receive image data to be displayed by the first color sub-pixels, another N interface circuits 101 are used to receive image data to be displayed by the second color sub-pixels, another N interface circuits 101 are used to receive image data to be displayed by the third color sub-pixels, and the remaining N interface circuits 101 are used to receive image data to be displayed by the fourth color sub-pixels. For example, the fourth color is white.

The interface circuits 101 may have the same structure.

It will be noted that, the image data received by each of the plurality of interface circuits 101 may be adjusted according to positions of the sub-pixels P in the display panel 100, which is not limited in the embodiments of the present disclosure. Moreover, the present disclosure does not limit an interface type of the interface circuit 101, and those skilled in the art may set it according to the actual situation.

For example, the interface circuit 101 may include a mini low-voltage differential signaling (Mini-LVDS) interface, a point to point (P2P) interface and the like.

Figure 9:
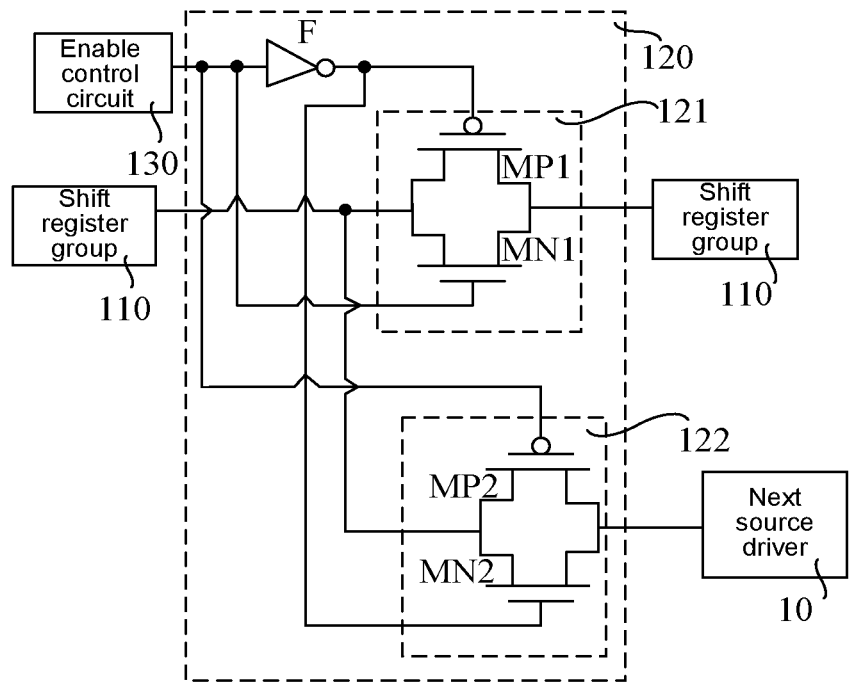
FIG. 9 is a diagram showing a structure of a switching circuit, in accordance with some embodiments of the present disclosure.

In some embodiments, as shown in FIG. 9, the switching circuit 120 includes a phase inverter F, a first transmission gate 121 and a second transmission gate 122.

As shown in FIG. 9, the first transmission gate 121 includes a first P-type transistor MP1 and a first N-type transistor MN1.

A gate of the first N-type transistor MN1 is electrically connected to an input terminal of the phase inverter F and the enable control circuit 130, and a gate of the first P-type transistor MP1 is electrically connected to an output terminal of the phase inverter F.

The last-stage shift register in the (n−1)-th shift register group is electrically connected to a first electrode of the first P-type transistor MP1 and a first electrode of the first N-type transistor MN1, and the first-stage shift register in the n-th shift register group is electrically connected to a second electrode of the first P-type transistor MP1 and a second electrode of the first N-type transistor MN1, where n is a positive integer greater than or equal to 2 (n≥2).

The second transmission gate 122 includes a second P-type transistor MP2 and a second N-type transistor MN2.

A gate of the second P-type transistor MP2 is electrically connected to the input terminal of the phase inverter F and the enable control circuit 130, and a gate of the second N-type transistor MN2 is electrically connected to the output terminal of the phase inverter F.

The last-stage shift register in the (n−1)-th shift register group is electrically connected to a first electrode of the second P-type transistor MP2 and a first electrode of the second N-type transistor MN2.

It will be noted that, in the case where the display panel 100 includes the plurality of cascaded source drivers 10, except for the last source driver 10, in each switching circuit 120 of the remaining source drivers 10, the second electrode of the second P-type transistor and the second electrode of the second N-type transistor are electrically connected to a next source driver 10. For example, the second electrode of the second P-type transistor and the second electrode of the second N-type transistor are electrically connected to a first-stage shift register in a first shift register group in the next source driver. The "next source driver 10" refers to a source driver 10 next to the source driver 10 where the second P-type transistor and the second N-type transistor are located. In each switching circuit 120 of the last source driver 10, the second electrode of the second P-type transistor and the second electrode of the second N-type transistor may not be electrically connected to other devices, i.e., in a floating state.

In the case where the display panel 100 includes one source driver 10, in each switching circuit 120 of the source driver 10, the second electrode of the second P-type transistor and the second electrode of the second N-type transistor may not be electrically connected to other devices, i.e., in a floating state.

It may be understood that, in a case where the first turn-on signal from the enable control circuit 130 is at a high level, the first N-type transistor MN1 is turned on, and the high-level first turn-on signal is changed into a low level through the phase inverter F, so that the first P-type transistor MP1 is turned on, and the second P-type transistor MP2 is turned off; the high-level first turn-on signal is changed into a low level through the phase inverter F, so that the second N-type transistor MN2 is turned off. In this case, in the switching circuit 120 between two adjacent shift register groups 110, the first transmission gate 121 is turned on, and the last-stage shift register in the present shift register group is connected to the first-stage shift register in the next shift register group, so that the next shift register group receives the second start signal DIO2 output by the present shift register group as the first start signal DIO1 of the next shift register group, and the next shift register group starts to operate.

In a case where the first turn-off signal from the enable control circuit 130 is at a low level, the first N-type transistor MN1 is turned off, and the low-level first turn-off signal is changed into a high level through the phase inverter F, so that the first P-type transistor MP1 is turned off, and the second P-type transistor MP2 is turned on; the low-level first turn-off signal is changed into a high level through the phase inverter F, so that the second N-type transistor MN1 is turned on. In this case, in the switching circuit 120 between two adjacent shift register groups 110, the first transmission gate 121 is turned off, and the last-stage shift register in the present shift register group is disconnected from the first-stage shift register in the next shift register group, so that the next shift register group does not operate. The second transmission gate 122 is turned on, the second start signal DIO2 output by the present shift register group is transmitted to the first-stage shift register in the first shift register group in the next-stage source driver as the first start signal DIO1 of the first shift register group in the next-stage source driver through the second transmission gate 122, so that the first shift register group starts to operate.

In some embodiments, the display panel 100 further includes a flexible printed circuit (FPC) and a printed circuit board (PCB), and the PCB is bonded to the display panel 100 through the FPC. The timing controller 20 may be integrated on the PCB, and the source driver(s) 10 may be disposed on the FPC. In addition, in a case where the display panel 100 further includes at least one of the gray scale controller 30, the power supply circuit and other components, the at least one of the gray scale controller 30, the power supply circuit and other components may also be integrated on the PCB.

Based on this, embodiments of the present disclosure provide a method for controlling a display panel. As shown in FIG. 1, the display panel 100 includes a plurality of sub-pixels P, at least one source driver, and a timing controller. Each sub-pixel P includes a pixel driving circuit T.

Referring to FIG. 3 and FIGS. 5 to 8, the source driver 10 is the source driver 10 described in any of the above embodiments. In a case where the source driver 10 further includes a gating circuit 140 and a plurality of digital-to-analog conversion circuit groups 150, the gating circuit 140 is electrically connected at least to the plurality of digital-to-analog conversion circuit groups 150 and a first reference signal terminal Vref1. A scanning time of a row of sub-pixels P includes a data writing period and a blanking period. The control method of the display panel 100 includes:

outputting a first turn-on signal or a first turn-off signal to the switching circuit 120, by the enable control circuit 130 of the source driver 10, under a control of an enable control signal from the timing controller 20; and sampling digitized image data, by the shift register group 110 of the source driver 10, under the control of the first start signal DIO1 from the timing controller 20 or a previous shift register group; and outputting the sampled digitized image data, by the shift registers 110 of the source driver 10.

It may be understood that, when the switching circuit 120 is turned on under the control of the first turn-on signal, the last-stage shift register in the (n−1)-th shift register group is connected to the first-stage shift register in the n-th shift register group, then the first start signal DIO1 of the n-th shift register group is output by the (n−1)-th shift register group, so that the n-th shift register group starts performing sampling. The switching circuit 120 disconnects the last-stage shift register in the (n−1)-th shift register group from the first-stage shift register in the n-th shift register group under the control of the first turn-off signal, so that the n-th shift register group will not perform sampling.

For example, the first shift register group samples the digitized image data under the control of the first start signal DIO1 from the timing controller 20, and the last-stage shift register in the first shift register group outputs the second start signal DIO2 as the first start signal DIO1 of the second shift register group at the same time as the sampling is finished.

If the last-stage shift register in the first shift register group is electrically connected to the first-stage shift register in the second shift register group through a switching circuit 120, when the switching circuit 120 is turned on under the control of the first turn-on signal, the second shift register group will receive the second start signal DIO2 output by the first shift register group as the first start signal DIO1 to start performing sampling; when the switching circuit 120 receives the first turn-off signal, the second shift register group is disconnected from the first shift register group, and the second shift register group does not perform sampling.

If the last-stage shift register in the first shift register group is directly connected to the first-stage shift register in the second shift register group, the second shift register group starts performing sampling as the sampling of the first shift register group is finished.

Based on this, the digital-to-analog conversion circuit group 150 of the source driver 10 converts the digitized image data from the shift register group 110 corresponding thereto into analog gray-scale signals according to gamma signals GMA from the gray scale controller 30, and outputs them.

During the data writing period, the gating circuit 140 outputs the analog gray-scale signals from the digital-to-analog conversion circuit groups 150, and the pixel driving circuits T receive the analog gray-scale signals from the source driver(s) 10.

During the blanking period, the gating circuit 140 outputs the first reference signal transmitted by the first reference signal terminal Vref1.

Based on this, referring to FIG. 3 and FIGS. 5 to 8, the gating circuit 140 is further electrically connected to the second reference signal terminal Vref2, in this case, the scanning time of the row of sub-pixels P further includes a threshold voltage compensation period.

The method for controlling the display panel 100 further includes: during the threshold voltage compensation period, outputting the second reference signal transmitted by the second reference signal terminal Vref2, by the gating circuit 140; and receiving the second reference signal, by the pixel driving circuits T, to perform threshold voltage compensation on the driving transistors in the pixel driving circuits T.

A method for driving each sub-pixel P in the display panel 100 will be described in detail below with reference to the pixel driving circuit T in FIG. 2.

As shown in FIG. 2, the pixel driving circuit T included in the sub-pixel P includes a first transistor M1, a second transistor M2, a driving transistor DT, and a capacitor C. A gate of the first transistor M1 is connected to a first gate line G1, a first electrode of the first transistor M1 is connected to a data line DL, and a second electrode of the first transistor M1 is connected to a gate of the driving transistor DT. A gate of the second transistor M2 is connected to a second gate line G2, a first electrode of the second transistor M2 is connected to a detection signal line SL, and a second electrode of the second transistor M2 is connected to a second electrode of the driving transistor DT. A first electrode of the driving transistor TD is connected to a first voltage terminal VDD, the second electrode of the driving transistor TD is connected to a first electrode of the light-emitting device L, and a second electrode of the light-emitting device L is grounded. A first electrode of the capacitor C is connected to the gate of the driving transistor DT, and a second electrode of the capacitor C is connected to the second electrode of the driving transistor DT.

It will be noted that, the first transistor M1, the second transistor M2 and the driving transistor DT may be N-type transistors or P-type transistors, in addition, they may be enhancement transistors or depletion transistors. The first electrodes of the first transistor M1, the second transistor M2 and the driving transistor DT may be sources and the second electrodes thereof may be drains, or the first electrodes of the above transistors may be drains and the second electrodes thereof may be sources, which is not limited in the embodiments of the present disclosure.

In addition, the first transistor M1, the second transistor M2 and the driving transistor DT in the embodiments of the present disclosure are described by taking N-type transistors as examples.

Based on this, a scanning time of a row of sub-pixels P includes: a blanking period, a reset period, a threshold voltage compensation period, a data writing period, and a light emitting period.

During the blanking period of the row, the first transistor M1 and the second transistor M2 are turned off, and the source driver 10 transmits the first reference signal output by the gating circuit 140 to the data line DL, so that a voltage of the signal of the data line DL is the same as a voltage $V_{ref1}$ of the first reference signal. At this time, the driving transistor DT is turned off, and the light-emitting device L does not emit light.

During the blanking period of the row, the source driver 10 transmits the second reference signal output by the gating circuit 140 to the data line DL, so that a voltage of the signal of the data line DL is changed into a voltage $V_{ref2}$ of the second reference signal. The first transistor M1 is turned on, and a voltage Vg of the gate of the driving transistor DT reaches the voltage $V_{ref2}$ of the second reference signal. The second transistor M2 is turned on, and a signal from the detection signal line SL is transmitted to the source of the driving transistor DT through the second transistor M2, so that a voltage $V_s$ of the source of the driving transistor DT is a voltage $V_{SL}$ of the signal from the detection signal line SL. When a gate-source voltage difference $V_{gs}$ of the driving transistor DT, which is equal to $(V_{ref2}-V_{SL})$, is greater than a threshold voltage $V_{th}$ of the driving transistor DT, the driving transistor DT is turned on.

It will be noted that, a voltage of the first electrode of the light-emitting device L is a voltage $V_{SL}$ of the signal from the detection signal line SL, the light-emitting device L is controlled not to emit light by the voltage $V_{SL}$ of the signal from the detection signal line SL during the reset period. Based on this, those skilled in the art may set the amplitudes of the voltage $V_{ref2}$ of the second reference signal and the voltage $V_{SL}$ of the signal from the detection signal line SL under a condition that the light-emitting device L does not emit light.

During the threshold voltage compensation period of the row, the first transistor M1 remains turn-on and the second transistor M2 is turned off. At this time, the voltage $V_g$ of the gate of the driving transistor DT is equal to $V_{ref2}$, the voltage $V_s$ of the source gradually changes to $(V_{ref2}-V_{th})$ from $V_{SL}$ in the reset period, and the driving transistor DT is gradually turned off, that is, the gate-source voltage difference $V_{gs}$ of the driving transistor DT gradually changes to the threshold voltage $V_{th}$ of the driving transistor DT from $(V_{ref2}-V_{SL})$, so that a detection of the threshold voltage $V_{th}$ of the driving transistor DT is completed, and the threshold voltage $V_{th}$ of the driving transistor DT may be compensated in the subsequent pixel data writing period, so as to eliminate an influence of the threshold voltage $V_{th}$ of the driving transistor DT on the actual driving. At this time, the light-emitting device L does not emit light.

During the data writing period of the row, the first transistor M1 remains turn-on, and the second transistor M2 is turn-off. The source driver 10 transmits analog gray-scale signals from the digital-to-analog conversion circuit 150 output by the gating circuit 140 to the data line DL, so that the analog gray-scale signals are written into the pixel driving circuit. At this time, the voltage of the gate of the driving transistor DT is a voltage $V_{data}$ of the analog gray-scale signals. At the same time, the analog gray-scale signals are stored in the capacitor C. In this case, the driving transistor DT is turned on.

Based on this, the voltage $V_s$ of the source of the driving transistor DT is equal to $(V_{ref2}-V_{th})$, and the voltage $V_g$ of the gate is equal to $V_{data}$, in this case, a driving current I flowing through the driving transistor DT satisfies the following conditions: $I=K\times(V_{gs}-V_{th})^2=K\times(V_{data}-V_{ref2}+V_{th}-V_{th})^2=K\times(V_{data}-V_{ref2})^2$, where K is a conductivity constant. It may be seen that, in this case, the driving current I flowing through the driving transistor DT is not related to the threshold voltage Vth of the driving transistor DT, so that the threshold voltage $V_{th}$ of the driving transistor DT is compensated, and the influence of the threshold voltage $V_{th}$ of the driving transistor DT on the actual driving is eliminated.

In the light emitting period of the row, both the first transistor M1 and the second transistor M2 are turned off. The capacitor C continuously discharges the gate of the driving transistor DT, so that the driving transistor DT remains turn-on, and the light-emitting device L emits light.

Transistors used in the embodiments of the present disclosure may be thin film transistors or field-effect transistors or other switching devices having the same properties. In internal circuits of the display panel, such as pixel driving circuits and shift register circuits, thin film transistors may be used. In integrated circuits (IC), such as the source driver 10 and the timing controller 20, field-effect transistors may be used.

A control electrode of each transistor used in the circuits provided in the embodiments of the present disclosure is a gate of the transistor, a first electrode of the transistor is one of a source and a drain of the transistor, and a second electrode of the transistor is the other one of the source and the drain of the transistor. Since the source and the drain of the transistor may be symmetrical in structure, there may be no difference in structure between the source and the drain of the transistor. That is, the first electrode and the second electrode of the transistor in the embodiments of the present disclosure may have no difference in structure. For example, in a case where the transistor is a P-type transistor, the first electrode of the transistor is the source, and the second electrode thereof is the drain. For example, in a case where the transistor is an N-type transistor, the first electrode of the transistor is the drain, and the second electrode thereof is the source.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area and a peripheral area, the display panel comprising:
    at least one source driver disposed in the peripheral area, each source driver including a plurality of shift register groups cascaded in sequence, an enable control circuit, and at least one switching circuit electrically connected to the enable control circuit; each shift register group including a plurality of stages of shift registers cascaded in sequence, the shift register group being configured to sample digitized image data under a control of a first start signal; a first start signal of an n-th shift register group being output by an (n–1)-th shift register group, n being a positive integer greater than 2; the enable control circuit configured to output a first turn-on signal or a first turn-off signal under a control of a level of an enable control signal from a timing controller; in two adjacent shift register groups, a last-stage shift register in a present shift register group being electrically connected to a first-stage shift register in a next shift register group through a switching circuit, the switching circuit being configured to connect the present shift register group to the next shift register group under a control of the first turn-on signal from the enable control circuit, and to disconnect the present shift register group and the next shift register group under a control of the first turn-off signal from the enable control circuit;
    a timing controller disposed in the peripheral area, the timing controller being electrically connected to the source driver, the timing controller being configured to transmit the first start signal to a first shift register group of a source driver, and to transmit the enable control signal to an enable control circuit of each source driver;
    wherein the display panel includes a plurality of source drivers, the plurality of source drivers are cascaded in sequence; and
    the switching circuit is further configured to connect the present shift register group to a first shift register group of a next source driver;
    wherein each switching circuit includes a phase inverter, a first transmission gate and a second transmission gate;
    the first transmission gate includes a first P-type transistor and a first N-type transistor;

a gate of the first N-type transistor is electrically connected to an input terminal of the phase inverter and the enable control circuit, and a gate of the first P-type transistor is electrically connected to an output terminal of the phase inverter; and a last-stage shift register in the (n−1)-th shift register group is electrically connected to a first electrode of the first P-type transistor and a first electrode of the first N-type transistor in a switching circuit electrically connected thereto, and a first-stage shift register in the n-th shift register group is electrically connected to a second electrode of the first P-type transistor and a second electrode of the first N-type transistor in a switching circuit electrically connected thereto;

the second transmission gate includes a second P-type transistor and a second N-type transistor;

a gate of the second P-type transistor is electrically connected to the input terminal of the phase inverter and the enable control circuit, and a gate of the second N-type transistor is electrically connected to the output terminal of the phase inverter; and the last-stage shift register in the (n−1)-th shift register group is further electrically connected to a first electrode of the second P-type transistor and a first electrode of the second N-type transistor in the switching circuit electrically connected thereto.

2. The display panel according to claim 1, the source driver further comprising:

a plurality of digital-to-analog conversion circuit groups; each digital-to-analog conversion circuit group corresponding to a shift register group, the digital-to-analog conversion circuit group being configured to convert digitized image data from the shift register group corresponding thereto into analog gray-scale signals according to gamma signals from a gray scale controller, and to output the analog gray-scale signals;

a gating circuit electrically connected at least to the digital-to-analog conversion circuit groups; the gating circuit being configured to electrically connect to a first reference signal terminal, and being further configured to output analog the gray-scale signals from the digital-to-analog conversion circuit group, or to output a first reference signal transmitted by the first reference signal terminal in different periods.

3. The display panel according to claim 2, wherein the gating circuit is further configured to electrically connect to a second reference signal terminal; and the gating circuit is configured to output the analog gray-scale signals from the digital-to-analog conversion circuit group, or to output the first reference signal transmitted by the first reference signal terminal, or to output a second reference signal transmitted by the second reference signal terminal in different periods.

4. The display panel according to claim 3, wherein a voltage of the first reference signal is greater than a minimum voltage of the analog gray-scale signals, and less than a maximum voltage of the analog gray-scale signals.

5. The display panel according to claim 2, further comprising:

a plurality of output buffer circuit groups, each output buffer circuit group being electrically connected to the gating circuit, the output buffer circuit group corresponding to a shift register group; except for an output buffer circuit group corresponding to a first shift register group, remaining output buffer circuit groups being electrically connected to the enable control circuit; wherein in the at least one switching circuit, a switching circuit receiving the first turn-on signal output by the enable control circuit is a target switching circuit, and a shift register group electrically connected to the target switching circuit and receiving the first start signal through the target switching circuit is a target shift register group;

the enable control circuit is further configured to in a case of outputting the first turn-on signal to the target switching circuit, output a second turn-on signal or a second turn-off signal to an output buffer circuit group corresponding to the target shift register group under the control of the level of the enable control signal from the timing controller;

the output buffer circuit group corresponding to the target shift register group is configured to output the analog gray-scale signals transmitted by the gating circuit or to output the first reference signal under a control of the second turn-on signal in different periods, and to stop operating under a control of the second turn-off signal; and the output buffer circuit group corresponding to the first shift register group is configured to output the analog gray-scale signals transmitted by the gating circuit or to output the first reference signal in different periods.

6. The display panel according to claim 5, wherein the gating circuit is further configured to electrically connect to a second reference signal terminal, the output buffer circuit group corresponding to the target shift register group is configured to output the analog gray-scale signals transmitted by the gating circuit, or to output the first reference signal, or to output a second reference signal under the control of the second turn-on signal in different periods, and to stop operating under the control of the second turn-off signal;

the output buffer circuit group corresponding to the first shift register group is configured to output the analog gray-scale signals transmitted by the gating circuit, or to output the first reference signal, or to output the second reference signal in different periods.

7. The display panel according to claim 2, further comprising:

a plurality of data latch circuit groups, each data latch circuit group corresponding to a shift register group and a digital-to-analog conversion circuit group;

the data latch circuit group being configured to store digitized image data from the shift register group corresponding thereto, and to output the stored digitized image data to the digital-to-analog conversion circuit group corresponding thereto under a control of a driving control signal.

8. The display panel according to claim 7, wherein the data latch circuit group includes a plurality of data latch circuits, a number of the data latch circuits included in the data latch circuit group is positively correlated with a number of shift registers included in the shift register group corresponding to the data latch circuit group.

9. The display panel according to claim 7, further comprising:

a level conversion circuit electrically connected between the plurality of data latch circuit groups and the plurality of digital-to-analog conversion circuit groups, wherein the level conversion circuit is configured to convert low-level digitized image data from the data latch circuit group into high-level digitized image data, and to output the high-level digitized image data to the digital-to-analog conversion circuit group corresponding to the data latch circuit group.

10. The display panel according to claim 1, the source driver further comprising:
a data processor electrically connected to the plurality of shift register groups, wherein
the data processor is configured to preprocess digitized image data, and to output the preprocessed digitized image data to the plurality of shift register groups.

11. The display panel according to claim 10, further comprising:
a plurality of interface circuits electrically connected to the data processor, wherein
the interface circuits are configured to convert image data from the timing controller into the digitized image data, and to output the converted digitized image data to the data processor.

12. The display panel according to claim 1, further comprising:
a plurality of sub-pixels located in the display area, each sub-pixel includes a pixel driving circuit; and
a plurality of data lines, the source driver being electrically connected to a plurality of pixel driving circuits through at least one data line.

13. A display apparatus, comprising the display panel according to claim 1.

14. A method for controlling a display panel, wherein the display panel includes a plurality of sub-pixels, a plurality of source drivers, a timing controller and a gray scale controller, each sub-pixel includes a pixel driving circuit;
each source driver is the source driver of the display panel according to claim 13; the source driver further includes a gating circuit and a plurality of digital-to-analog conversion circuit groups, the gating circuit is electrically connected at least to the plurality of digital-to-analog conversion circuit groups and a first reference signal terminal; a scanning time of a row of sub-pixels includes a data writing period and a blanking period;
the method comprises:
outputting the first turn-on signal or the first turn-off signal to the switching circuit, by the enable control circuit of the source driver, under the control of the enable control signal from the timing controller;
sampling digitized image data, by a shift register group of the source driver, under a control of a first start signal from the timing controller or a previous shift register group;
outputting the sampled digitized image data, by the shift register group;
connecting the present shift register group to the next shift register group, by the switching circuit, under the control of the first turn-on signal from the enable control circuit, wherein the first N-type transistor is turned on under the control of the first turn-on signal from the enable control circuit; the first turn-on signal is changed through the phase inverter, so that the first P-type transistor is turned on; in two adjacent shift register groups; in the switching circuit between two adjacent shift register groups, the first transmission gate is turned on, and the last-stage shift register in the (n−1)-th shift register group is connected to the first-stage shift register in the n-th shift register group, so that the next shift register group receives receives a second start signal output by the (n−1)-th shift register group as the first start signal of the n-th shift register group, and the n-th shift register group starts performing sampling;
disconnecting the present shift register group and the next shift register group, by the switching circuit, under the control of the first turn-off signal from the enable control circuit, wherein the first N-type transistor is turned off under the control of the first turn-off signal from the enable control circuit; the first turn-off signal is changed through the phase inverter, so that the first P-type transistor is turned off; in the switching circuit between the two adjacent shift register groups, the first transmission gate is turned off, and the last-stage shift register in the (n−1)-th shift register group is disconnected from the first-stage shift register in the n-th shift register group, so that the n-th shift register group is not performed sampling;
connecting the present shift register group to the first shift register group in the next-stage source driver, by the switching circuit, under the control of the first turn-off signal from the enable control circuit, wherein the second P-type transistor is turned on under the control of the first turn-off signal from the enable control circuit; the first turn-off signal is changed through the phase inverter, so that the second N-type transistor is turned on; the second transmission gate is turned on, the second start signal output by the present shift register group is transmitted to the first-stage shift register in the first shift register group in the next-stage source driver as the first start signal of the first shift register group in the next-stage source driver through the second transmission gate, so that the first shift register group starts performing sampling;
converting digitized image data from a shift register group corresponding to each digital-to-analog conversion circuit group into analog gray-scale signals, by the digital-to-analog conversion circuit group, according to gamma signals from the gray scale controller;
outputting the analog gray-scale signals, by the digital-to-analog conversion circuit group;
during the data writing period, outputting the analog gray-scale signals from the digital-to-analog conversion circuit group, by the gating circuit;
receiving the analog gray-scale signals from the source driver, by the pixel driving circuit; and
during the blanking period, outputting a first reference signal transmitted by the first reference signal terminal, by the gating circuit.

15. The method according to the claim 14, wherein the gating circuit further electrically connected to a second reference signal terminal; the scanning time of the row of sub-pixels further includes a threshold voltage compensation period;
the method further comprises:
during the threshold voltage compensation period, outputting a second reference signal transmitted by the second reference signal terminal, by the gating circuit; and
receiving the second reference signal, by the pixel driving circuit, to compensate for a threshold voltage of a driving transistor in the pixel driving circuit.

* * * * *